United States Patent
Lee et al.

(10) Patent No.: US 12,538,647 B2
(45) Date of Patent: Jan. 27, 2026

(54) METHOD OF MANUFACTURING DISPLAY APPARATUS AND DISPLAY APPARATUS

(71) Applicant: SAMSUNG DISPLAY CO., LTD., Yongin-si (KR)

(72) Inventors: Jaeho Lee, Yongin-si (KR); Taeho An, Yongin-si (KR); Kangyoon Kim, Yongin-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 442 days.

(21) Appl. No.: 18/145,738

(22) Filed: Dec. 22, 2022

(65) Prior Publication Data
US 2023/0269965 A1    Aug. 24, 2023

(30) Foreign Application Priority Data
Feb. 21, 2022    (KR) .................. 10-2022-0022460

(51) Int. Cl.
*H10K 50/844*    (2023.01)
*H10K 59/40*    (2023.01)

(52) U.S. Cl.
CPC ........... *H10K 50/844* (2023.02); *H10K 59/40* (2023.02)

(58) Field of Classification Search
None
See application file for complete search history.

(56) References Cited

U.S. PATENT DOCUMENTS

| | | | |
|---|---|---|---|
| 8,174,179 B2 | 5/2012 | Suh | |
| 8,901,544 B2 | 12/2014 | He et al. | |
| 10,734,601 B2 | 8/2020 | Choi | |
| 11,673,829 B2 | 6/2023 | Lee et al. | |
| 11,807,933 B2 | 11/2023 | Cho | |
| 11,912,603 B2 | 2/2024 | Sung et al. | |
| 2012/0135177 A1* | 5/2012 | Cornejo | B24C 1/10 225/2 |
| 2012/0135195 A1 | 5/2012 | Glaesemann et al. | |
| 2014/0130548 A1* | 5/2014 | Lee | B23K 26/38 65/30.14 |
| 2014/0186590 A1 | 7/2014 | Ryu | |

(Continued)

FOREIGN PATENT DOCUMENTS

| | | |
|---|---|---|
| CN | 104045227 A | 9/2014 |
| JP | 2011136855 A | 7/2011 |
| KR | 1020090030704 A | 3/2009 |

(Continued)

*Primary Examiner* — Kyoung Lee
(74) *Attorney, Agent, or Firm* — CANTOR COLBURN LLP

(57) ABSTRACT

A method of manufacturing a display apparatus includes: preparing a mother substrate; forming a concave portion, which comprises a first concave portion defined on a first surface of the mother substrate and a second concave portion defined on a second surface opposite to the first surface; reinforcing the mother substrate; and cutting the mother substrate in a lengthwise direction of the concave portion. A reinforcement thickness, which is a thickness of a reinforced part of a non-concave portion of the mother substrate from the first surface, is greater than half a value obtained by subtracting a depth of the first concave portion and a depth of the second concave portion, from a thickness of the non-concave portion of the mother substrate.

15 Claims, 10 Drawing Sheets

(56) References Cited

U.S. PATENT DOCUMENTS

2014/0284366 A1   9/2014  Cho et al.
2017/0285818 A1* 10/2017  Kim ..................... G06F 3/0412

FOREIGN PATENT DOCUMENTS

| KR | 1020100007265 A | 1/2010 |
| KR | 101258403 B1 | 4/2013 |
| KR | 1020140086536 A | 7/2014 |
| KR | 1020160116243 A | 10/2016 |
| KR | 101985988 B1 | 6/2019 |
| KR | 1020210130293 A | 11/2021 |
| KR | 1020220019881 A | 2/2022 |

* cited by examiner

METHOD OF MANUFACTURING DISPLAY APPARATUS AND DISPLAY APPARATUS

This application claims priority to Korean Patent Application No. 10-2022-0022460, filed on Feb. 21, 2022, and all the benefits accruing therefrom under 35 U.S.C. § 119, the content of which in its entirety is herein incorporated by reference.

BACKGROUND

1. Field

One or more embodiments relate to methods of manufacturing a display apparatus and display apparatuses, and more particularly, to methods of manufacturing a display apparatus and display apparatuses, in which process efficiency may be improved and the thickness of a display apparatus may be reduced.

2. Description of the Related Art

An electronic apparatus has been widely used. The electronic apparatus is variously used as a mobile electronic apparatus and a stationary electronic apparatus, and the electronic apparatus includes a display apparatus capable of providing a user with visual information, such as image or a video, to support various functions.

The display apparatus is generally equipped with a cover window to protect the display apparatus. In this case, however, to arrange a cover window, an adhesive layer is desirable to be provided, and thus, the thickness of a display apparatus increases and production costs are raised.

SUMMARY

One or more embodiments provide methods of manufacturing a display apparatus, and display apparatuses, in which, after a base substrate is reinforced, a reinforced substrate is cut in units of cells and used in the display apparatus, and thus, process efficiency may be effectively improved and the thickness of a display apparatus may be reduced.

However, such an aspect is exemplary, and the aspect of the present disclosure to solve is not limited thereby.

Additional aspects will be set forth in part in the description which follows and, in part, will be apparent from the description, or may be learned by practice of the presented embodiments of the disclosure.

According to an aspect of the disclosure, a method of manufacturing a display apparatus includes: preparing a mother substrate; forming a concave portion, which includes a first concave portion defined on a first surface of the mother substrate and a second concave portion defined on a second surface opposite to the first surface; reinforcing the mother substrate; and cutting the mother substrate in the lengthwise direction of the concave portion. A reinforcement thickness, which is a thickness of a reinforced part of a non-concave portion of the mother substrate from the first surface, is greater than half a value obtained by subtracting a depth of the first concave portion and a depth of the second concave portion, from a thickness of the non-concave portion of the mother substrate.

In an embodiment, the concave portion may include first areas, which are inclined and disposed at each of opposite end portions of the concave portion, respectively, and a second area, which is flat and connects the first areas, and the second area may be reinforced over an entire thickness.

In an embodiment, each of the first areas may be inclined by about 20 degrees (°) to about 50° with respect to a direction perpendicular to the first surface of the mother substrate.

In an embodiment, the width of the second area in a direction perpendicular to the lengthwise direction may be about 50 micrometers (µm) to about 200 µm.

In an embodiment, the mother substrate may be an encapsulation substrate, and the method may further include, before the cutting of the mother substrate, placing the mother substrate on a base substrate where a display layer is disposed, to face the display layer.

In an embodiment, the mother substrate may include a sealing member by which a space between the mother substrate and the base substrate in a periphery is sealed.

In an embodiment, the method may further include placing an optical functional layer at a side opposite to a side where the display layer may be disposed, of the mother substrate.

In an embodiment, the optical functional layer may be an outermost layer, which is exposed to an external environment.

In an embodiment, the method may further include placing a touch sensor layer between the mother substrate and the optical functional layer.

In an embodiment, the method may further include, before the cutting of the mother substrate, placing a display layer and an encapsulation layer on the first surface of the mother substrate.

In an embodiment, the method may further include placing an optical functional layer on the second surface of the mother substrate.

In an embodiment, the optical functional layer may be an outermost layer, which may be exposed to an external environment.

In an embodiment, the reinforcing of the mother substrate may include a first reinforcement using sodium nitrate ($NaNO_3$) and potassium nitrate ($KNO_3$) and a second reinforcement using potassium nitrate ($KNO_3$).

In an embodiment, in the first reinforcement, a time to preheat the mother substrate may be between about 100 minutes to about 200 minutes, and a time for slow cooling the mother substrate may be between about 100 minutes to about 200 minutes.

In an embodiment, in the second reinforcement, a time to preheat the mother substrate may be between about 100 minutes to about 200 minutes, and a time for slow cooling the mother substrate may be between about 100 minutes to about 200 minutes.

According to another aspect of the disclosure, a display apparatus includes a base substrate; a display layer disposed on the base substrate and which emits light in a direction opposite to a direction toward the base substrate; an encapsulation substrate disposed on the display layer and chemically reinforced; and an optical functional layer disposed on the encapsulation substrate that is reinforced, and exposed to an external environment.

In an embodiment, a perimeter area of the encapsulation substrate may include an inclined area in which a thickness of the encapsulation substrate gradually decreases in an outward direction.

In an embodiment, a reinforcement thickness, which is a thickness of a chemically reinforced part of a non-perimeter area of the encapsulation substrate from one surface of the encapsulation substrate may be greater than half a value obtained by subtracting depth of the inclined area from a thickness of the non-perimeter area of the encapsulation substrate.

In an embodiment, a part of the perimeter area of the encapsulation substrate may be reinforced over an entire thickness.

In an embodiment, the incline area may have an angle of about 20° to about 50° with respect to a direction perpendicular to one surface of the encapsulation substrate.

Other aspects, features, and advantages than those described above, will become apparent from the following drawings, claims, and detailed descriptions to embody the disclosure below.

BRIEF DESCRIPTION OF THE DRAWINGS

The above and other aspects, features, and advantages of certain embodiments of the disclosure will be more apparent from the following description taken in conjunction with the accompanying drawings, in which.

DETAILED DESCRIPTION

Figure 1:
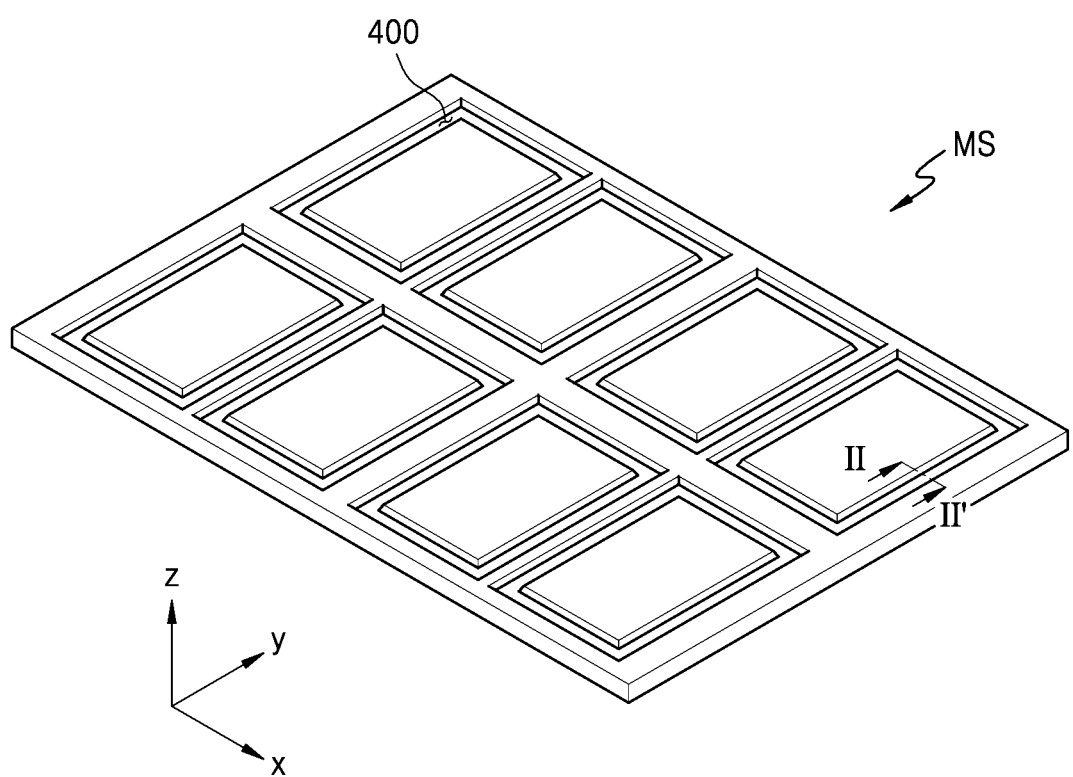
FIG. 1 is a schematic perspective view of a mother substrate according to one or embodiments.

Reference will now be made in detail to embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects of the present description. As used herein, the term "and/or" includes any and all combinations of one or more of the associated listed items. Throughout the disclosure, the expression "at least one of a, b or c" indicates only a, only b, only c, both a and b, both a and c, both b and c, all of a, b, and c, or variations thereof.

Various modifications may be applied to the present embodiments, and particular embodiments will be illustrated in the drawings and described in the detailed description section. The effect and features of the present embodiments, and a method to achieve the same, will be clearer referring to the detailed descriptions below with the drawings. However, the present embodiments may be implemented in various forms, not by being limited to the embodiments presented below.

Hereinafter, exemplary embodiments will be described, in detail, with reference to the accompanying drawings, and in the description with reference to the drawings, the same or corresponding constituents are indicated by the same reference numerals and redundant descriptions thereof are omitted.

In the following embodiment, it will be understood that although the terms "first," "second," etc. may be used herein to describe various components, these components should not be limited by these terms. These components are only used to distinguish one component from another.

In the following embodiment, the expression of singularity in the specification includes the expression of plurality unless clearly specified otherwise in context.

In the following embodiment, it will be further understood that the terms "comprises" and/or "comprising" used herein specify the presence of stated features or components, but do not preclude the presence or addition of one or more other features or components.

In the following embodiment, it will be understood that when a layer, region, or component is referred to as being "formed on" another layer, region, or component, it can be directly or indirectly formed on the other layer, region, or component.

Sizes of components in the drawings may be exaggerated for convenience of explanation. For example, since sizes and thicknesses of components in the drawings are arbitrarily illustrated for convenience of explanation, the following embodiments are not limited thereto.

In the following embodiment, the x-axis, the y-axis and the z-axis are not limited to three axes of the rectangular coordinate system, and may be interpreted in a broader sense. For example, the x-axis, the y-axis, and the z-axis may be perpendicular to one another, or may represent different directions that are not perpendicular to one another.

When a certain embodiment may be implemented differently, a specific process order may be performed differently from the described order. For example, two consecutively described processes may be performed substantially at the same time or performed in an order opposite to the described order.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10% or 5% of the stated value.

Hereinafter, a method of manufacturing a display apparatus according to an embodiment is described with reference to the accompanying drawings.

FIG. 1 is a schematic perspective view of a mother substrate MS according to an embodiment.

Referring to FIG. 1, the mother substrate MS may be a rectangular substrate having a side in a first direction, for example, an x direction of FIG. 1 and a side in a second direction, for example, a y direction of FIG. 1. The mother substrate MS may be provided as a large substrate so as to be cut into a plurality of substrates each having a size of a cell unit.

A concave portion 400 may be formed in the mother substrate MS. The concave portion 400 may be a portion that is formed to be concave by being hollowed out from one surface of the mother substrate MS, and the thickness of the mother substrate MS is formed to be relative thin. In an embodiment, the concave portion 400 may be formed by a laser beam, wheel cutting, or partially etching.

In an embodiment, the concave portion 400 may be formed along the perimeter of a cell in the mother substrate MS. Accordingly, the concave portion 400 may form, for example, a rectangular closed loop, and also, the concave portion 400 may be provided as a plurality of closed circuits according to the number of cells.

Figure 2:
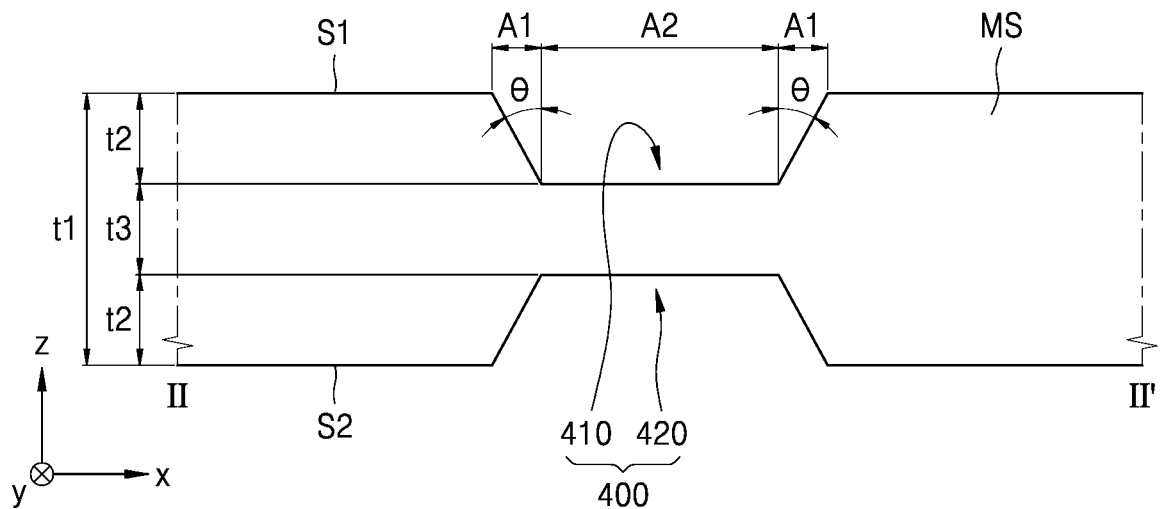
FIG. 2 is a schematic cross-sectional view of the mother substrate taken along line II-II' of FIG. 1.

FIG. 2 is a schematic cross-sectional view of the mother substrate MS taken along line II-II' of FIG. 1.

Referring to FIG. 2, the concave portion 400 may include a first concave portion 410 formed on a first surface S1, for example, a major upper surface in a +z direction of FIG. 2, of the mother substrate MS, and a second concave portion 420 formed on a second surface S2, for example, a major bottom surface in −z direction of FIG. 2, opposite to the first surface S1 of the mother substrate MS.

In an embodiment, the first concave portion 410 and the second concave portion 420 may be arranged to face each other in a direction, for example, the z direction of FIG. 2, perpendicular to the first surface S1 of the mother substrate MS. For example, the first concave portion 410 and the second concave portion 420 may completely overlap each other, when viewed in the direction perpendicular to the first surface S1 of the mother substrate MS (i.e., in a plan view). Alternatively, the first concave portion 410 and the second concave portion 420 may have an interval in the first direction (the x direction of FIG. 2) to partially overlap each other, when viewed in the direction perpendicular to the first surface S1 of the mother substrate MS (i.e., in a plan view). In the following description, for convenience of explanation, a case in which the first concave portion 410 and the second concave portion 420 completely overlap each other in the direction perpendicular to the first surface S1 of the mother substrate MS, without having an interval in the first direction, is mainly described.

As described above, the first concave portion 410 and the second concave portion 420 may each be formed as a closed circuit along the perimeter of each cell. As the first concave portion 410 and the second concave portion 420 are similar to each other, in the following description, the first concave portion 410 is mainly described.

The first concave portion 410 may include a first area A1 that is inclined at opposite end portions in a width direction, that is, in the first direction (the x direction of FIG. 2). In the first area A1, the thickness of the mother substrate MS may gradually decrease toward the center of the first concave portion 410. Accordingly, the first concave portion 410 may have an inclined angle θ with respect to a direction perpendicular to the first surface S1 of the mother substrate MS in the first area A1.

In an embodiment, in the first area A1, the inclined angle θ may be about 20 degrees (°) to about 50°, particularly about 40°. When the inclined angle θ is too small, during cutting of the mother substrate MS, stress concentrates on the first concave portion 410, and when the inclined angle θ is too great, dead space may increase.

Furthermore, the first concave portion 410 may include a second area A2 that is flat and connected to the first areas A1 inclined at opposite end portions. The first concave portion 410 may have a substantially flat surface (i.e., plane defined by x direction and y direction) in the second area A2, which may provide a cutting surface as described below when the mother substrate MS is cut in units of cells. A depth t2 of the first concave portion 410 may be defined as a distance from the first surface S1 of the mother substrate MS, in which the area of the first concave portion 410 is not defined, to the substantially flat surface of the mother substrate MS in the second area A2 of the first concave portion 410 in the z direction.

In an embodiment, the width of the second area A2 in x direction may be about 50 micrometers (μm) to about 200 μm. When the width of the second area A2 is too small, it may be difficult to provide a cutting surface when cutting the mother substrate MS in units of cells. When the width of the second area A2 is too great, dead space may increase.

Meanwhile, the first concave portion 410 may extend in a lengthwise direction, that is, the second direction (the y direction of FIG. 2), and be formed through a laser beam, wheel cutting, partial etching, or the like.

Figure 3:
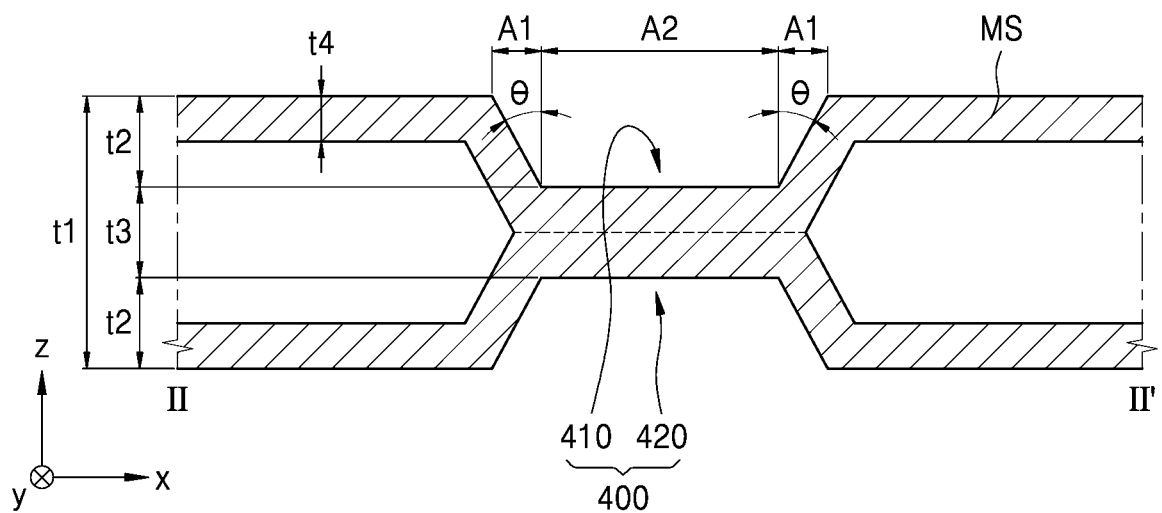
FIG. 3 is a schematic cross-sectional view showing reinforcement of a mother substrate according to one or embodiments.

FIG. 3 is a schematic cross-sectional view showing reinforcement of the mother substrate MS according to an embodiment.

Referring to FIG. 3, a reinforcement process may be performed on the mother substrate MS. The reinforcement process may be, for example, a chemical reinforcement process. In other words, the reinforcement process may reinforce a base substrate through ion exchange of a surface of a reinforcement target substrate using a reinforcement solution. In detail, by substituting ions having a relatively small ionic radius, for example, Li ions or Na ions, with ions having a relatively large ionic radius, for example, K ions, on the surface of the mother substrate MS, compression stress may be generated in a surface area of the mother substrate MS, and thus, the strength characteristics of the mother substrate MS may be effectively improved.

By immersing the mother substrate MS in a reinforcement solution, the mother substrate MS may be gradually reinforced from the first surface S1 and the second surface S2 of the mother substrate MS toward the center of the mother substrate MS in the thickness direction (i.e., z direction) thereof. In other words, a reinforcement thickness t4 of the mother substrate MS in the z direction may be adjusted by controlling a degree of reinforcement of the mother substrate MS. The reinforcement thickness t4 means the thickness of the surface of the mother substrate MS that is reinforced through ion substitution, and may be referred to as a reinforcement depth (depth of layer, DOL).

In an embodiment, the reinforcement thickness t4 may be greater than half a value obtained by subtracting the depth t2 of the first concave portion 410 and a depth t2 of the second concave portion 420, from a thickness t1 of a non-concave portion of the mother substrate MS in the z direction. The non-concave portion may be a portion of the mother substrate MS except for the first concave portion 420 and the second concave portion 420. This may be expressed by an inequality that $t4 > (t1 - 2*t2)/2$.

In other words, as the value obtained by subtracting the depth t2 of the first concave portion 410 and the depth t2 of the second concave portion 420 from the thickness t1 of the mother substrate MS in z direction may be substantially the same as a thickness t3 of the concave portion 400 in the second area A2, the reinforcement thickness t4 may be greater than half the thickness t3 of the concave portion 400 in the second area A2. In other words, this may be expressed as $t4 > t3/2$.

Accordingly, the thickness t3 of the concave portion 400, in detail, in the second area A2, may be entirely reinforced. Furthermore, in an area of the mother substrate MS where the concave portion 400 is not disposed, while only a partial thickness from an upper surface S1 or a bottom surface S2 may be reinforced, another partial thickness of the center of the mother substrate MS in the thickness direction thereof may not be reinforced.

This is to remove a central tensile force and generate only compression stress in the concave portion 400 so that the mother substrate MS may be reinforced and prevented from being broken during cutting. In detail, when the mother substrate MS is reinforced, compression stress is generated in a reinforced surface, and as a reaction thereto, a tensile force may be generated at the center of the mother substrate MS. The tensile force at the center of the mother substrate MS breaks a cut portion of the mother substrate MS during cutting, and thus, a cut section does not form a uniform plane and the cut section may be damaged so that cracks of the mother substrate MS may be propagated from the cut section. This may result in the lowering of the quality of a display apparatus.

In contrast, according to an embodiment, as the mother substrate MS in the second area A2 is entirely reinforced in the thickness direction, no central tensile force may be generated, and thus, the breakage of the mother substrate MS may be prevented when the mother substrate MS is cut along the second area A2. Accordingly, it may be possible to cut the mother substrate MS in units of cells after reinforcement.

According to the related art, when the mother substrate MS is reinforced partially and then cut in units of cells, a cut portion may be broken due to the central tensile force of the mother substrate MS, so a method of cutting the mother substrate MS and then reinforcing each substrate in units of cells has been used. A conductive layer is stacked on each of cut substrates or each substrate is cemented to a conductive layer, thereby reducing process efficiency.

For this reason, layers are stacked without reinforcing the mother substrate MS, or the mother substrate MS is cut after cemented to the stacked layers, and to protect a display panel of such a cell unit, a cover window is disposed in the outermost layer. When a cover window is disposed, an adhesive layer to attach the cover window is necessary, and due to the cover window and the adhesive layer, the thickness of a display panel or a display apparatus may increase, and as the distance between a touch sensor layer and a user's touch surface increases, sensitivity of a touch may be lowered.

In contrast, according to an embodiment, the mother substrate MS may be cut after reinforcement entirely in the second area A2, and thus after the conductive layer or the like is stacked on the mother substrate MS, the mother substrate MS may be cut in units of cells. Furthermore, as the mother substrate MS is reinforced, without disposing a separate cover window, a display panel may have the strength characteristics.

Figure 4:
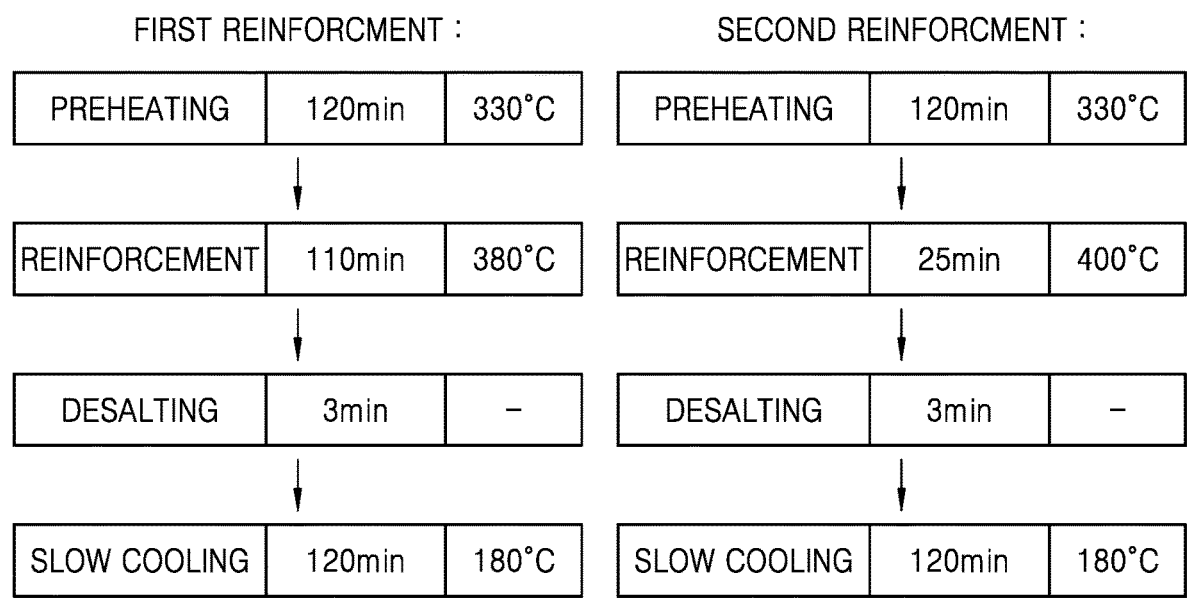
FIG. 4 schematically shows a reinforcement process according to one or embodiments.

FIG. 4 schematically shows a reinforcement process according to an embodiment.

Referring to FIG. 4, the above-described reinforcement process of the mother substrate MS, in detail, a chemical reinforcement process, may be performed in a process illustrated in FIG. 4.

The reinforcement process may include a first reinforcement and a second reinforcement. By performing reinforcement twice in the present reinforcement process, the mother substrate MS may be more uniformly reinforced.

In the first reinforcement, a preheating operation may improve uniformity of reinforcement, and may prevent damage of the mother substrate MS due to thermal shock. In the preheating operation, the mother substrate MS may be preheated at a temperature of about 330 degrees in Celsius (° C.) for about 100 minutes to about 200 minutes, particularly for about 120 minutes.

Next, a reinforcement operation may be performed. In the reinforcement operation, the mother substrate MS is immersed in a reinforcement solution so that the mother substrate MS may be reinforced through ion exchange. In this state, the reinforcement solution may be a solution in which sodium nitrate ($NaNO_3$) and potassium nitrate ($KNO_3$) are mixed at a weight ratio of about 3:7. The mother substrate MS may be immersed in the reinforcement solution at a temperature of about 380° C. for about 110 minutes. Accordingly, reinforcement is performed as ions of the mother substrate MS, for example, lithium (Li) ions, are substituted with ions having a large ionic radius, such as sodium (Na) ions or potassium (K) ions.

After the reinforcement operation, a desalting operation for removing residual salt may be performed. The desalting operation may take about 3 minutes.

Thereafter, a slow cooling operation may be performed. In the slow cooling operation, compression stress is applied to the surface of the mother substrate MS such that the breakage of the mother substrate MS due to thermal shock may be prevented. The slow cooling operation may be performed at a temperature of about 180° C. for about 100 minutes to about 200 minutes, particularly for about 120 minutes.

Thereafter, an operation of clearing the mother substrate MS may be followed.

In the second reinforcement, similar to the first reinforcement, the preheating operation may be performed again at a temperature of about 330° C. for about 100 minutes to about 200 minutes, particularly for about 120 minutes, to preheat the mother substrate MS.

Thereafter, the reinforcement operation may be performed. In this state, the reinforcement solution may be a $KNO_3$ solution not including $NaNO_3$. The mother substrate MS may be immersed in the reinforcement solution at a temperature of about 400° C. for about 25 minutes. Accordingly, reinforcement is performed as the ions, for example, Li ions, of the mother substrate MS are substituted by ions having a large ionic radius, such as K ions.

Next, the desalting operation is performed for about 3 minutes, and the slow cooling operation may be performed. The slow cooling operation may be performed at a temperature of about 180° C. for about 100 minutes to about 200 minutes, particularly for about 120 minutes. Then, the operation of cleaning the mother substrate MS may be followed.

In the first reinforcement and the second reinforcement, in particular, in the preheating operation and the slow cooling operation, preheating and slow cooling each is performed for about 100 minutes to about 200 minutes, particularly for about 120 minutes, so that the thermal shock of the mother substrate MS may be reduced.

Figure 5:
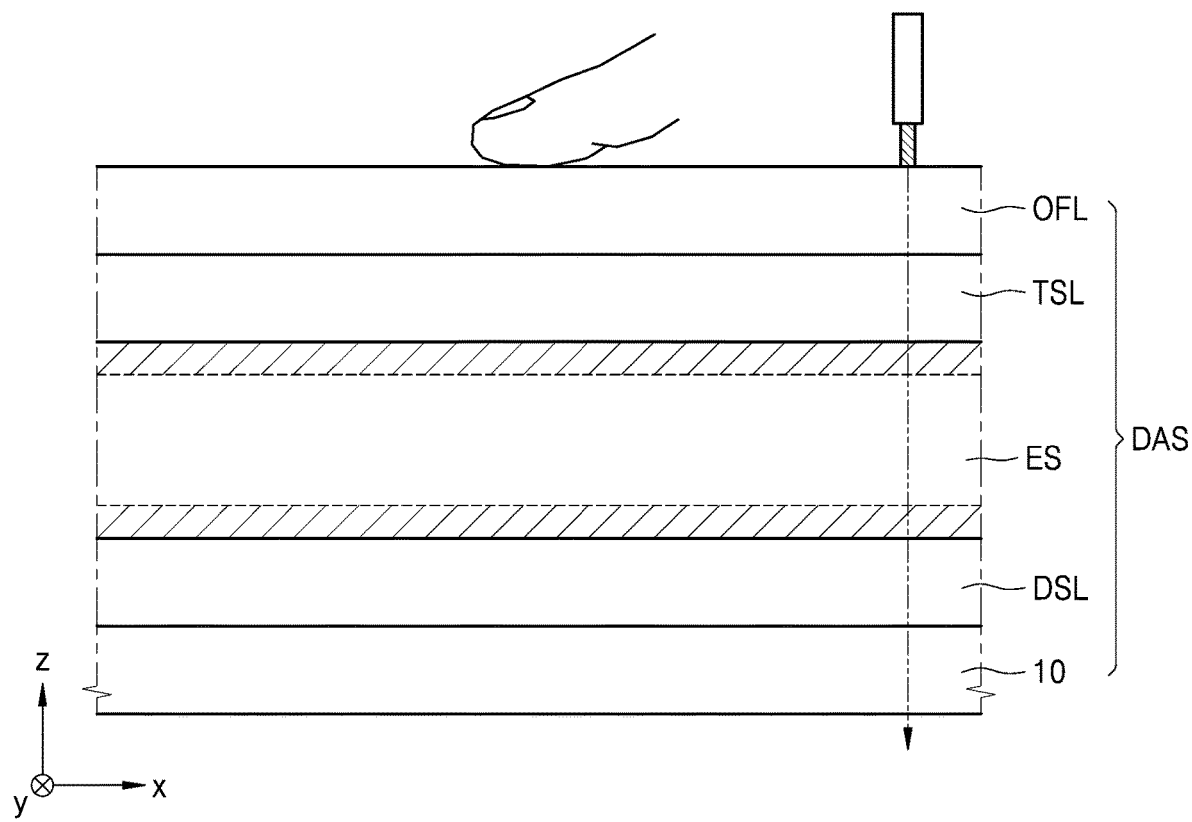
FIG. 5 is a schematic cross-sectional view showing a method of manufacturing a display apparatus, according to one or embodiments.

FIG. 5 is a schematic cross-sectional view showing a method of manufacturing a display apparatus, according to an embodiment.

Referring to FIG. 5, a display layer DSL may be disposed on a base substrate 10. In this state, the base substrate 10 may be provided as a large substrate to be cut into a plurality of substrates each having a size in units of cells. The display layer DSL may include a display element layer for emitting light through a light-emitting area and a pixel electrode layer electrically connected to the display element layer.

An encapsulation substrate ES may be cemented to the display layer DSL. In this state, the encapsulation substrate ES may be the mother substrate MS of FIG. 3 that is reinforced as described above. The encapsulation substrate ES is accordingly a large substrate, and may include a concave portion (not shown) formed along the perimeter of a cell.

A touch sensor layer TSL may be disposed on the encapsulation substrate ES. Furthermore, an optical functional layer OFL is disposed on the touch sensor layer TSL, thereby forming a display assembly DAS.

Next, all layers that are disposed, including the encapsulation substrate ES that is reinforced, may be cut. In other words, a display apparatus may be manufactured by cutting, in units of cells, the display assembly DAS that is formed by disposing layers on the base substrate 10 that is large. In this state, the display assembly DAS may be cut along the lengthwise direction (e.g., y direction) of the concave portion 400 of FIG. 3 of the encapsulation substrate ES. In an embodiment, the display assembly DAS may be cut by irradiating a laser beam in a direction, for example, a −z direction of FIG. 5, perpendicular to a flat surface (i.e., surface defined by x direction and y direction) of the second area A2 of FIG. 3 of the concave portion 400.

As such, by using the mother substrate MS that is reinforced as the encapsulation substrate ES, the display assembly DAS is completed, and even when the display assembly DAS is cut at once in units of cells, the encapsulation substrate ES may not be broken at the cut portion. Accordingly, as the encapsulation substrate ES in a reinforced state may be used in a display apparatus, no separate cover window to protect the display apparatus may be necessary. In other words, the optical functional layer OFL may be the outermost layer having a user contact surface in the thickness direction of the encapsulation substrate ES. Accordingly, as a cover window and an adhesive layer to attach the cover window to an optical functional layer OFL may be omitted, production costs may be reduced and a manufacturing process may be effectively simplified. Furthermore, as the cover window and the adhesive layer are omitted, a distance between a user's touch surface and the touch sensor layer TSL is reduced, and thus, touch sensitivity is improved and power consumption may be effectively improved.

Figure 6:
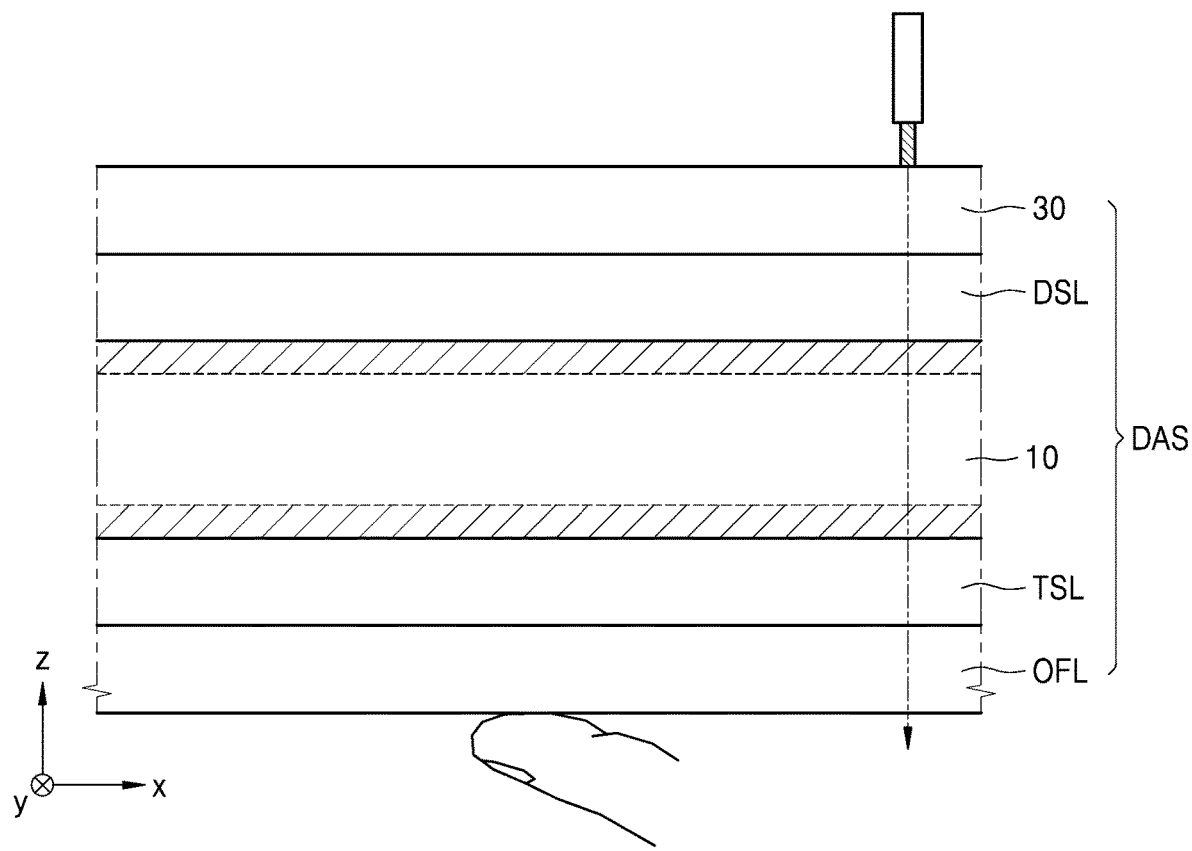
FIG. 6 is a schematic cross-sectional view showing a method of manufacturing a display apparatus, according to one or embodiments.

FIG. 6 is a schematic cross-sectional view showing a method of manufacturing a display apparatus, according to another embodiment. In the following description, differences from the above-described embodiment are mainly described.

Referring to FIG. 6, the present manufacturing process for a display apparatus may be a manufacturing process for a bottom emission type display apparatus.

In other words, the display layer DSL and an encapsulation layer 30 may be disposed on the base substrate 10. In this state, the base substrate 10 may be the mother substrate MS of FIG. 3 that is reinforced described above. Accordingly, the base substrate 10 may be a large substrate, and may include a concave portion (not shown) formed along the perimeter of a cell. The encapsulation layer 30 may be a thin film encapsulation layer, unlike the above-described embodiment.

The touch sensor layer TSL may be disposed on a side of the base substrate 10 opposite to a side where the display layer DSL is disposed. Furthermore, the optical functional layer OFL is disposed on the touch sensor layer TSL, thereby forming the display assembly DAS. In the bottom emission type display apparatus, light is emitted toward the base substrate 10 to display an image, and thus, the touch sensor layer TSL and the optical functional layer OFL may be disposed on the base substrate 10. Accordingly, the base substrate 10 adjacent to user contact surface may be used as a reinforced substrate.

Next, similar to the above-described embodiment, all layers disposed, including the base substrate 10 that is reinforced, may be cut. In other words, a display apparatus may be manufactured by cutting the display assembly DAS in units of cells. In this state, the display assembly DAS may be cut in the lengthwise direction (e.g., y direction) of the concave portion 400 of FIG. 3 of the base substrate 10 that is reinforced. In an embodiment, the display assembly DAS may be cut by irradiating a laser beam in a direction, for example, a −z direction of FIG. 5, perpendicular to a flat surface of the second area A2 of FIG. 3 of the concave portion 400.

In the above case, as the base substrate 10 is reinforced, no separate cover window may be necessary. In other words, in this case, the optical functional layer OFL may be the outermost layer having a user contact surface in the thickness direction of the base substrate 10.

Figure 7:
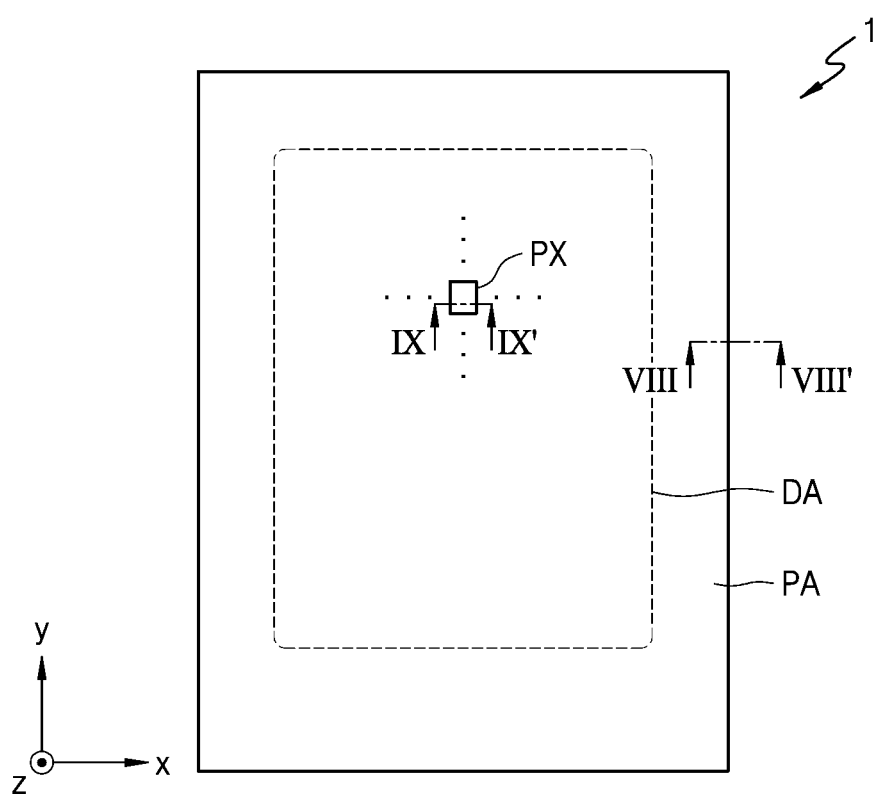
FIG. 7 is a schematic plan view of a display apparatus according to one or embodiments.

FIG. 7 is a schematic plan view of a display apparatus 1 according to an embodiment. The display apparatus 1 may be manufactured by the above-described method of manufacturing a display apparatus.

Referring to FIG. 7, the display apparatus 1 manufactured according to an embodiment may include a display area DA and a peripheral area PA disposed outside the display area DA. The display apparatus 1 may provide an image through an array of a plurality of pixels PX arranged in two dimensions in the display area DA.

The peripheral area PA is an area that does not provide an image, and may entirely or partially surround the display area DA. A driver and the like for providing an electrical signal or power to a pixel circuit corresponding to each of the pixels PX may be disposed in the peripheral area PA. A pad that is an area to which an electronic device, a printed circuit board, and the like is electrically connected may be disposed in the peripheral area PA.

In the following description, although the display apparatus 1 includes an organic light-emitting diode ("OLED") as a light-emitting element, the display apparatus 1 is not limited thereto. In another embodiment, the display apparatus 1 may be a light-emitting display apparatus including an inorganic light-emitting diode, that is, an inorganic light-emitting display apparatus. In another embodiment, the display apparatus 1 may be a quantum-dot light-emitting display apparatus.

The display apparatus 1 may be used as a display screen of not only portable electronic apparatuses, such as mobile phones, smartphones, tablet personal computers ("PCs"), mobile communication terminals, electronic organizers, electronic books, portable multimedia players ("PMPs"), navigation devices, ultra mobile PCs ("UMPCs"), and the like, but various products, such as televisions, notebook computers, monitors, billboards, internet of things ("IOT"), and the like. Furthermore, the display apparatus 1 according to an embodiment may be used in wearable devices, such as smart watches, watch phones, glasses type displays, and head mounted displays ("HMDs"). Furthermore, the display apparatus 1 according to an embodiment may be used as an instrument panel of a vehicle, a center information display ("CID") disposed in the center fascia or dashboard of a vehicle, a room mirror display in lieu of a side mirror of a vehicle, or a display screen disposed at the rear surface of a front seat as an entertainment device for a rear seat of a vehicle.

Figure 8:
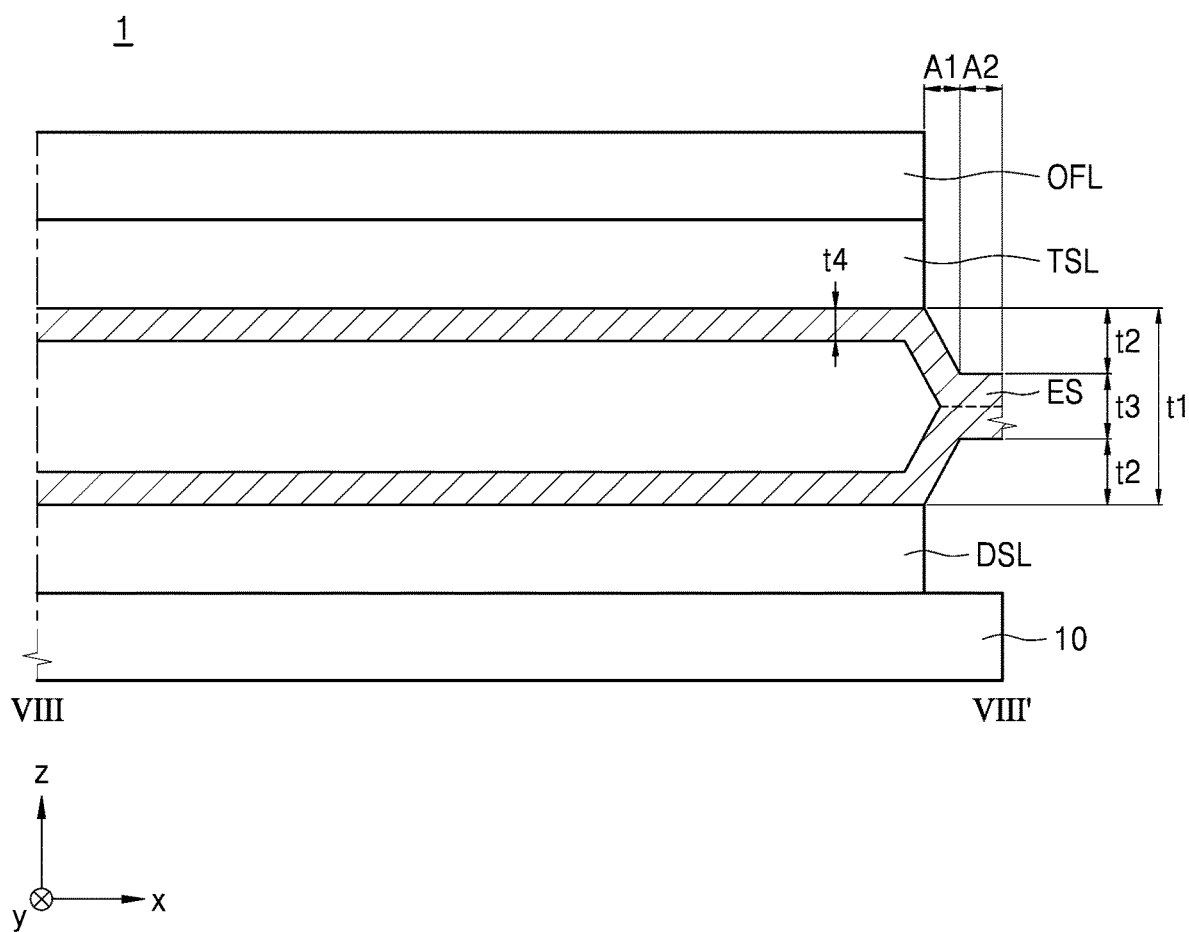
FIG. 8 is a schematic cross-sectional view of a display apparatus taken along line VIII-VIII' of FIG. 7.

FIG. 8 is a schematic cross-sectional view of the display apparatus 1 taken along line VIII-VIII' of FIG. 7.

Referring to FIG. 8, as described above, the encapsulation substrate ES may be a chemically reinforced substrate. In other words, the encapsulation substrate ES may correspond to the above-described mother substrate MS, and the display apparatus 1 may be manufactured by the above-described method of manufacturing a display apparatus.

Accordingly, in an embodiment, a concave portion in which the above-described first and second concave portions 410 and 420 of FIG. 3 each are cut to half may be disposed in a perimeter area of the encapsulation substrate ES. In other words, the perimeter area of the encapsulation substrate ES may include the first area A1 that is inclined as the thickness t1 of the encapsulation substrate ES gradually decreases. In other words, in the first area A1, the thickness of the encapsulation substrate ES may gradually decrease in an outward direction. The second area A2 that is substantially flat may be disposed outside the first area A1 (a side in an x direction of FIG. 8).

Furthermore, the surface of the encapsulation substrate ES may include a chemically reinforced portion. In an embodiment, the reinforcement thickness t4 of a non-perimeter area of the encapsulation substrate ES may be greater than half a value obtained by subtracting the depths t2 of the half-cut concave portions from the thickness t1 of the non-perimeter area of the encapsulation substrate ES. In other words, the reinforcement thickness t4 of the non-perimeter area of the encapsulation substrate ES may be expressed by inequality that t4>(t1−2*t2)/2.

In another expression, the reinforcement thickness t4 of the non-perimeter area in the z direction may be greater than the half of the thickness t3 of the encapsulation substrate ES in the second area A2 that is the outermost side in the perimeter area of the encapsulation substrate ES. In other words, the reinforcement thickness t4 of the non-perimeter area of the encapsulation substrate ES may be expressed by inequality that t4>t3/2.

Accordingly, the encapsulation substrate ES may be entirely reinforced in a partial area, for example, in the second area A2 in its perimeter area through all the thickness t3. Furthermore, in the other area of the encapsulation substrate ES, while only a part corresponding a partial thickness from a surface to the center of the encapsulation substrate ES in the thickness direction may be reinforced, the central portion of the encapsulation substrate ES in the thickness direction (i.e., z direction) may not be reinforced.

In this case, as described above, as no cover window is necessary, the optical functional layer OFL may be the outermost layer having a user contact surface in the thickness direction.

Figure 9:
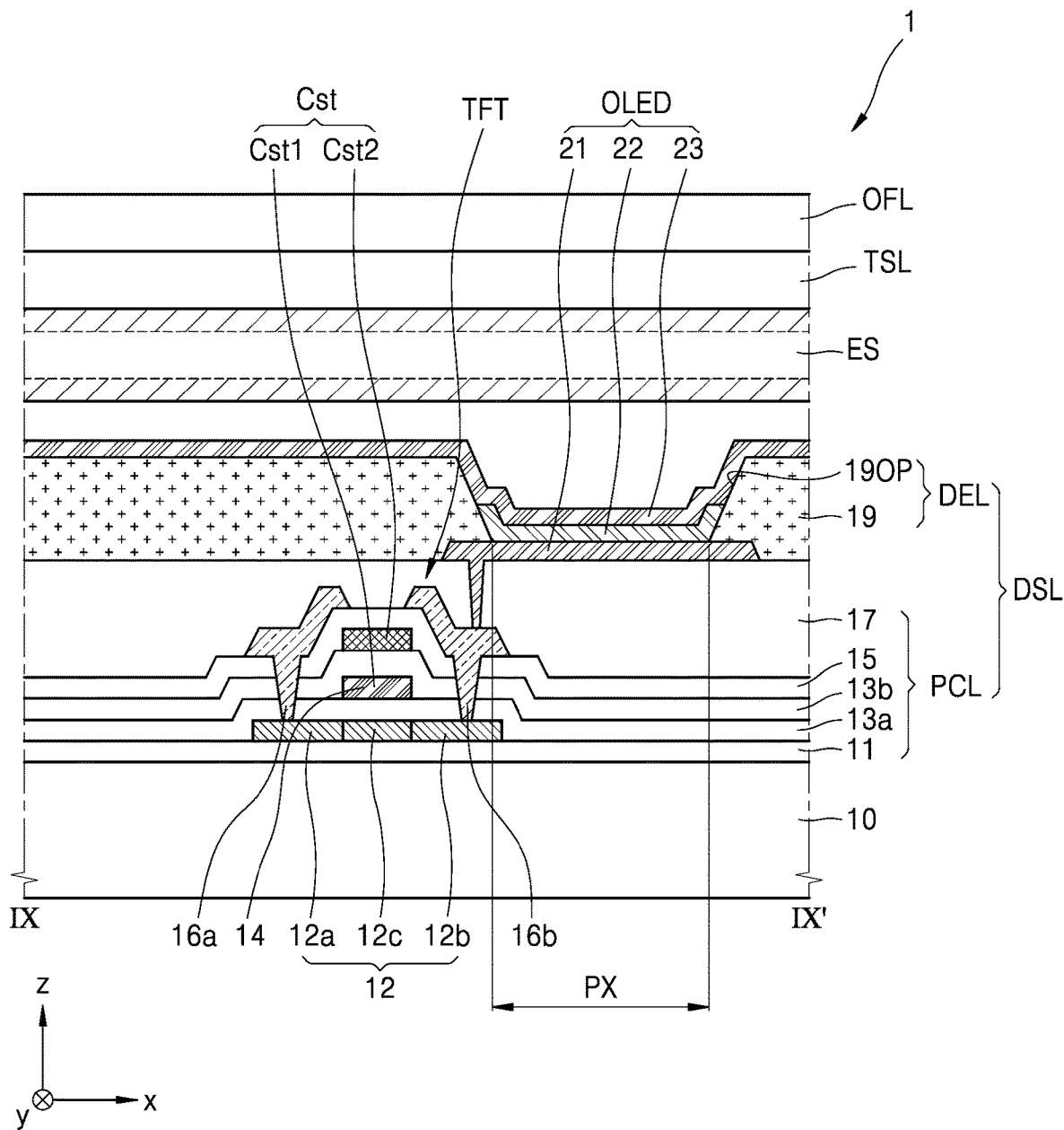
FIG. 9 is a schematic cross-sectional view of a display apparatus taken along line IX-IX' of FIG. 7.

FIG. 9 is a schematic cross-sectional view of a display apparatus taken along line IX-IX' of FIG. 7.

Referring to FIG. 9, the display apparatus 1 may include the base substrate 10, a pixel circuit layer PCL, a display element layer DEL, the encapsulation substrate ES, a touch electrode layer TSL, and the optical functional layer OFL.

The base substrate 10 may include glass or polymer resin. In this state, the polymer resin may include at least one of polyethersulfone, polyarylate, polyetherimide, polyethylene naphthalate, polyethylene terephthalate, polyphenylene sulfide, polyimide, polycarbonate, cellulose triacetate, cellulose acetate propionate, and the like.

The pixel circuit layer PCL may be disposed on the base substrate 10. FIG. 9 illustrates that the pixel circuit layer PCL includes a thin film transistor TFT, and a buffer layer 11, a first insulating layer 13a, a second insulating layer 13b, a third insulating layer 15, and a planarization layer 17, which are disposed below or/and above constituent elements of the thin film transistor TFT.

The buffer layer 11 may reduce or block infiltration of foreign materials, moisture, or external air from under the base substrate 10, and may provide a planarized surface on the base substrate 10. The buffer layer 11 may include an inorganic insulating material, such as a silicon nitride, a silicon oxynitride, and a silicon oxide, and may be a single layer or multilayer including the above-described inorganic insulating material.

The thin film transistor TFT on the buffer layer 11 may include a semiconductor layer 12, and the semiconductor layer 12 may include polysilicon. Alternatively, the semiconductor layer 12 may include amorphous silicon, an oxide semiconductor, an organic semiconductor, and the like. The semiconductor layer 12 may include a channel region 12c, and a drain region 12a and a source region 12b disposed at both sides of the channel region 12c. A gate electrode 14 may overlap the channel region 12c.

The gate electrode 14 may include a low-resistance metal material. The gate electrode 14 may include a conductive material including molybdenum (Mo), aluminum (Al), copper (Cu), titanium (Ti), and the like, and may be formed in a multilayer or single layer including the above-described material.

The first insulating layer 13a may be provided between the semiconductor layer 12 and the gate electrode 14. The first insulating layer 13a may include an inorganic insulating material, such as a silicon oxide ($SiO_2$), a silicon nitride ($SiN_X$), a silicon oxynitride (SiON), an aluminum oxide ($Al_2O_3$), a titanium oxide ($TiO_2$), a tantalum oxide ($Ta_2O_5$), a hafnium oxide ($HfO_2$), a zinc oxide ($ZnO_X$), or the like. In this state, $ZnO_X$ may be a zinc oxide (ZnO) and/or a zinc peroxide ($ZnO_2$).

The second insulating layer 13b may cover the gate electrode 14. The second insulating layer 13b may include an inorganic insulating material, such as $SiO_2$, $SiN_X$, SiON, $Al_2O_3$, $TiO_2$, $Ta_2O_5$, $HfO_2$, $ZnO_X$, or the like. In this state, $ZnO_X$ may be ZnO and/or $ZnO_2$.

An upper electrode Cst2 of a storage capacitor Cst may be disposed on the second insulating layer 13b. The upper electrode Cst2 may at least partially overlap the gate electrode 14 disposed thereunder. The gate electrode 14 and the upper electrode Cst2 overlapping each other with the second insulating layer 13b therebetween may form the storage capacitor Cst. In other words, the gate electrode 14 may function as a lower electrode Cst1 of the storage capacitor Cst.

As such, the storage capacitor Cst and the thin film transistor TFT may overlap each other. Alternatively, in an embodiment, the storage capacitor Cst may not overlap the thin film transistor TFT. In other words, the lower electrode Cst1 of the storage capacitor Cst may be formed apart from the gate electrode 14, as a separate constituent element from the gate electrode 14.

The upper electrode Cst2 may include Al, platinum (Pt), palladium (Pd), silver (Ag), magnesium (Mg), gold (Au), nickel (Ni), neodymium (Nd), iridium (Ir), chromium (Cr), calcium (Ca), Mo, Ti, tungsten (W), and/or Cu, and may be a single layer or multilayer including the above-described material.

The third insulating layer 15 may cover the upper electrode Cst2. The third insulating layer 15 may include an inorganic insulating material, such as $SiO_2$, $SiN_X$, SiON, $Al_2O_3$, $TiO_2$, $Ta_2O_5$, $HfO_2$, $ZnO_X$, or the like. In this state, $ZnO_X$ may be ZnO and/or $ZnO_2$. The third insulating layer 15 may be a single layer or multilayer including the above-described inorganic insulating material.

A drain electrode 16a and a source electrode 16b may each be provided on the third insulating layer 15. The drain electrode 16a and the source electrode 16b may be respectively connected to the drain region 12a and the source region 12b through contact holes in the insulating layers thereunder. The drain electrode 16a and the source electrode 16b may include a material having excellent conductivity. The drain electrode 16a and the source electrode 16b may be include a conductive material including Mo, Al, Cu, Ti, and the like, and may be formed in a multilayer or single layer. In an embodiment, the drain electrode 16a and the source electrode 16b may have a multilayer structure of Ti/Al/Ti.

The planarization layer 17 may include an organic insulating material. The planarization layer 17 may include an organic insulating material, such as general purpose polymers such as polymethylmethacrylate ("PMMA") or polystyrene ("PS"), polymer derivatives having a phenolic group, acrylic polymers, imide-based polymers, arylether-based polymers, amide-based polymers, fluorine-based polymers, p-xylene-based polymers, vinyl alcohol-based polymers, and blends thereof.

The display element layer DEL may be disposed on the pixel circuit layer PCL having the above-described structure. The display element layer DEL may include an organic light-emitting diode OLED as a light-emitting element, and the organic light-emitting diode OLED may have a stack structure of a pixel electrode 21, a light-emitting layer 22, and a common electrode 23. The pixel electrode 21 of the organic light-emitting diode OLED may be electrically connected to the thin film transistor TFT through a contact hole defined in the planarization layer 17.

The pixel electrode 21 may include a conductive oxide, such as an indium tin oxide ("ITO"), an indium zinc oxide ("IZO"), a zinc oxide (ZnO), an indium oxide ($In_2O_3$), an indium gallium oxide ("IGO"), or an aluminum zinc oxide ("AZO"). In an embodiment, the pixel electrode 21 may include a reflective film including Ag, Mg, Al, Pt, Pd, Au, Ni, Nd, Ir, Cr, or a compound thereof. Alternatively, in an embodiment, the pixel electrode 21 may further include a film formed of ITO, IZO, ZnO, or $In_2O_3$ above/below the above-described reflective film.

A pixel defining layer 19 having an opening 190P that exposes at least a part of the pixel electrode 21 may be disposed on the pixel electrode 21. The pixel defining layer 19 may include an organic insulating material and/or an inorganic insulating material. The opening 190P may define a light-emitting area of the light emitted from the organic light-emitting diode OLED. For example, the size/width of the opening 190P may correspond to the size/width of the light-emitting area. Accordingly, the size and/or width of a pixel PX may depend on the size and/or width of the opening 190P of the pixel defining layer 19 corresponding thereto.

The light-emitting layer 22 may be disposed in the opening 190P of the pixel defining layer 19. The light-emitting layer 22 may include a polymer organic material or a low molecular weight organic material that emits light of a certain color. Alternatively, the light-emitting layer 22 may include an inorganic light-emitting material or quantum dots.

Although not illustrated, a first functional layer and a second functional layer may be respectively disposed below and above the light-emitting layer 22. The first functional layer may include, for example, a hole transport layer ("HTL"), or include HTL and a hole injection layer ("HIL"). The second functional layer may include an electron transport layer ("ETL") and/or an electron injection layer ("EIL"). However, the disclosure is not limited thereto. The first functional layer and the second functional layer may be optionally and respectively disposed above and below the light-emitting layer 22.

The first functional layer and/or the second functional layer may be common layers that entirely cover the base substrate 10, like the common electrode 23 described below.

The common electrode 23 may be disposed above the pixel electrode 21, and may overlap the pixel electrode 21. The common electrode 23 may include a conductive material having a low work function. For example, the common electrode 23 may include a (semi-)transparent layer including Ag, Mg, Al, Pt, Pd, Au, Ni, Nd, Ir, Cr, Li, Ca, an alloy thereof, or the like. Alternatively, the common electrode 23 may further include a layer, such as ITO, IZO, ZnO, or $In_2O_3$ on the (semi-)transparent layer including the above-described material. The common electrode 23 may be formed integrally to entirely cover the base substrate 10.

The encapsulation substrate ES may be disposed above the display element layer DEL. The encapsulation substrate ES may cover the display element layer DEL. The encapsulation substrate ES may be provided as a transparent member. Accordingly, the light emitted from the light-emitting layer 22 may proceed to the outside through the encapsulation substrate ES. In an embodiment, the encapsulation substrate ES may maintain a gap from the display element layer DEL by a spacer (not shown). Furthermore, the encapsulation substrate ES may be bonded to the base substrate 10 by a sealing member disposed in the peripheral area PA, and a space between the base substrate 10 and the encapsulation substrate ES may be hermetically sealed. Accordingly, the display element layer DEL disposed between the base substrate 10 and the encapsulation substrate ES may be blocked from external moisture, air, or other impurities by the sealing.

The touch sensor layer TSL including touch electrodes is disposed on the encapsulation substrate ES, and the optical functional layer OFL may be disposed on the touch sensor layer TSL. The touch sensor layer TSL may obtain coordinates information according to an external input, for example, a touch event. The optical functional layer OFL may reduce the reflectivity of light (external light) externally incident on the display apparatus 1, and may improve the color purity of the light emitted from the display apparatus 1.

In an embodiment, the optical functional layer OFL may include a retarder and/or a polarizer. The retarder may be of a film type or a liquid crystal coated type, and may include a λ/2 retarder and/or a λ/4 retarder. The polarizer may also be of a film type or a liquid crystal coated type. The film type may include a stretchable synthetic resin film, and the liquid crystal coated type may include liquid crystals aligned in a certain array. The retarder and the polarizer may further include a protective film.

In an embodiment, the optical functional layer OFL may include a destructive interference structure. The destructive interference structure may include a first reflective layer and a second reflective layer disposed on different layers. First reflective light and second reflective light respectively reflected from the first reflective layer and the second reflective layer may be destructively interfered, and accordingly, the reflectivity of external light may be reduced.

Figure 10:
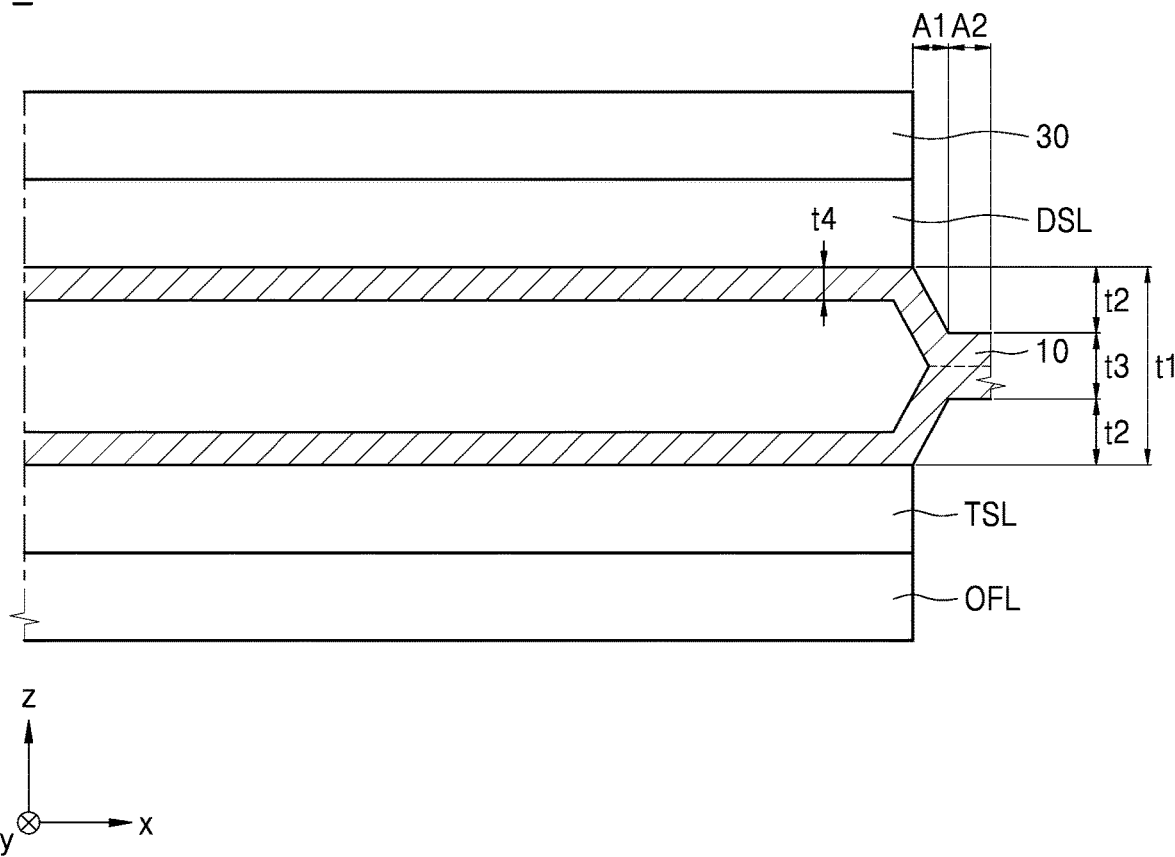
FIG. 10 is a schematic cross-sectional view of a display apparatus according to one or more embodiments.

FIG. 10 is a schematic cross-sectional view of a display apparatus according to another embodiment. As the embodiment of FIG. 10 is similar to the embodiment of FIG. 8, differences are mainly described in the following description.

Referring to FIG. 10, the base substrate 10 may be a chemically reinforced substrate, as described above. In other words, the base substrate 10 may correspond to the above-described mother substrate MS, and the display apparatus 1 may be manufactured by the above-described method of manufacturing a display apparatus.

Accordingly, in an embodiment, the perimeter area of the base substrate 10 may include the first area A1 that is inclined and in which the thickness t1 of the base substrate 10 gradually decreases. Furthermore, the surface of the base substrate 10 may include a chemically reinforced portion.

In the present embodiment, the display apparatus 1 may be a bottom emission type display apparatus. Accordingly, the touch sensor layer TSL is disposed at a side opposite to a side where the display layer DSL is disposed in the base substrate 10, and the optical functional layer OFL may be disposed on the touch sensor layer TSL. The optical functional layer OFL may be the outermost layer having a user contact surface in the thickness direction of the display apparatus 1.

Figure 11:
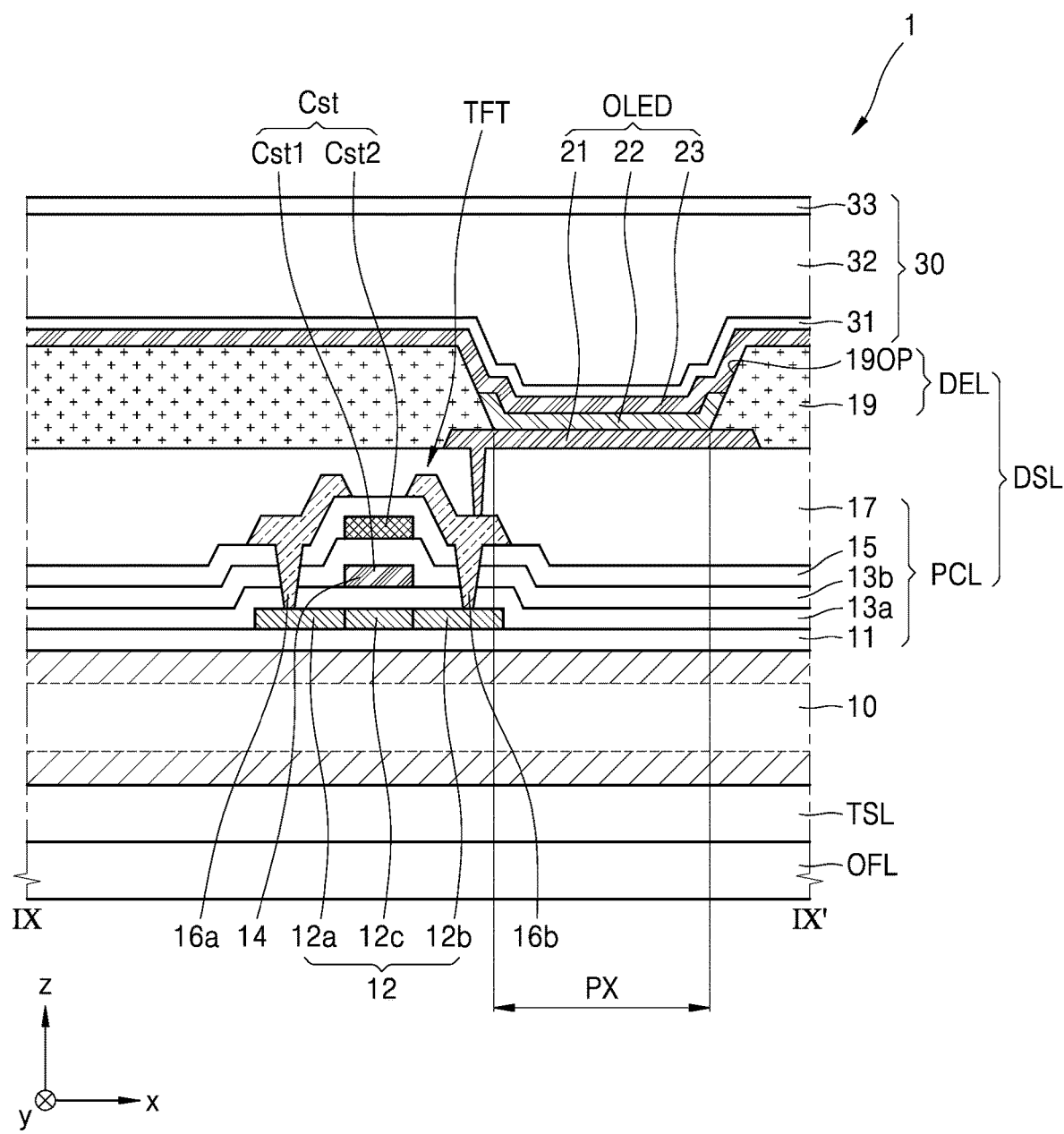
FIG. 11 is a schematic cross-sectional view of a display apparatus according to one or more embodiments.

FIG. 11 is a schematic cross-sectional view of a display apparatus according to another embodiment. As the embodiment of FIG. 11 is similar to the embodiment of FIG. 9, differences are mainly described in the following description.

Referring to FIG. 11, the encapsulation layer 30 may be disposed on the display element layer DEL. In an embodiment, the encapsulation layer 30 may be provided as a thin film encapsulation layer, not the encapsulation substrate ES. The encapsulation layer 30 may be disposed on the display element layer DEL and may cover the display element layer DEL. An encapsulation layer TFE may include at least one inorganic film layer and at least one organic film layer. In an embodiment, the encapsulation layer 30 may include a first inorganic film layer 31, an organic film layer 32, and a second inorganic film layer 33, which are sequentially stacked.

The first inorganic film layer 31 and the second inorganic film layer 33 may include one or more inorganic materials from among an aluminum oxide, a titanium oxide, a tantalum oxide, a hafnium oxide, a zinc oxide, a silicon oxide, a silicon nitride, and a silicon oxynitride. The organic film layer 32 may include a polymer-based material. The polymer-based material may include acrylic resin, epoxy-based resin, polyimide, polyethylene, and the like. In an embodiment, the organic film layer 32 may include acrylate. The organic film layer 32 may be formed by curing a monomer or by coating a polymer.

Furthermore, in the present embodiment, as the display apparatus 1 is a bottom emission type display apparatus, the pixel electrode 21, as a transmissive electrode, may transmit the light emitted from the light-emitting layer 22. Furthermore, in this case, the common electrode 23, as a reflective electrode, may reflect the light emitted from the light-emitting layer 22 to display an image through a bottom surface of the base substrate 10.

According to one or more embodiments, by reinforcing a substrate and then cutting the reinforced substrate in units of cells, the reinforced substrate may be used in a display apparatus, and accordingly, process efficiency may be effectively improved.

Furthermore, a cover window may be unnecessary, and thus, the thickness of a display apparatus may be reduced and production costs may be saved.

Furthermore, as an adhesive layer and a cover window are unnecessary, the sensitivity of a touch sensor layer may be effectively improved, and power consumption may be improved.

The effects of the present disclosure are not limited to the above-described effects, and other various effects that are not described in the specification may be clearly understood from the following descriptions by one skilled in the art to which the present disclosure belongs.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope as defined by the following claims.

What is claimed is:

1. A method of manufacturing a display apparatus, the method comprising:
preparing a mother substrate;
forming a concave portion, which comprises a first concave portion defined on a first surface of the mother substrate and a second concave portion defined on a second surface opposite to the first surface;
reinforcing the mother substrate; and
cutting the mother substrate in a lengthwise direction of the concave portion,
wherein a reinforcement thickness, which is a thickness of a reinforced part of a non-concave portion of the mother substrate from the first surface, is greater than half a value obtained by subtracting a depth of the first concave portion and a depth of the second concave portion, from a thickness of the non-concave portion of the mother substrate.

2. The method of claim 1, wherein the concave portion comprises first areas, which are inclined and disposed at opposite end portions of the concave portion, respectively, and a second area, which is flat and connects the first areas, and
the second area is reinforced over an entire thickness.

3. The method of claim 2, wherein each of the first areas is inclined by about 20 degrees (°) to about 50° with respect to a direction perpendicular to the first surface of the mother substrate.

4. The method of claim 2, wherein a width of the second area in a direction perpendicular to the lengthwise direction is about 50 micrometers (μm) to about 200 μm.

5. The method of claim 1, further comprising:
before the cutting of the mother substrate, placing the mother substrate on a base substrate where a display layer is disposed, to face the display layer,
wherein the mother substrate is an encapsulation substrate.

6. The method of claim 5, wherein the mother substrate comprises a seal member by which a space between the mother substrate and the base substrate in a periphery is sealed.

7. The method of claim 5, further comprising:
placing an optical functional layer at a side opposite to a side, where the display layer is disposed, of the mother substrate.

8. The method of claim 7, wherein the optical functional layer is an outermost layer, which is exposed to an external environment.

9. The method of claim 7, further comprising:
placing a touch sensor layer between the mother substrate and the optical functional layer.

10. The method of claim 1, further comprising:
before the cutting of the mother substrate, placing a display layer and an encapsulation layer on the first surface of the mother substrate.

11. The method of claim 10, further comprising:
placing an optical functional layer on the second surface of the mother substrate.

12. The method of claim 11, wherein the optical functional layer is an outermost layer, which is exposed to an external environment.

13. The method of claim 1, wherein the reinforcing of the mother substrate comprises a first reinforcement using sodium nitrate ($NaNO_3$) and potassium nitrate ($KNO_3$) and a second reinforcement using potassium nitrate ($KNO_3$).

14. The method of claim 13, wherein, in the first reinforcement, a time to preheat the mother substrate is between about 100 minutes to about 200 minutes, and a time for slow cooling the mother substrate is between about 100 minutes to about 200 minutes.

15. The method of claim 13, wherein, in the second reinforcement, a time to preheat the mother substrate is between about 100 minutes to about 200 minutes, and a time for slow cooling the mother substrate is between about 100 minutes to about 200 minutes.

* * * * *